United States Patent
Pan et al.

(10) Patent No.: US 8,513,688 B2
(45) Date of Patent: Aug. 20, 2013

(54) METHOD FOR ENHANCING ELECTRICAL INJECTION EFFICIENCY AND LIGHT EXTRACTION EFFICIENCY OF LIGHT-EMITTING DEVICES

(75) Inventors: Chang-Chi Pan, Taoyuan (TW); Ching-hwa Chang Jean, Taoyuan (TW); Jang-ho Chen, Taoyuan (TW)

(73) Assignee: Walsin Lihwa Corporation (TW)

( * ) Notice: Subject to any disclaimer, the term of this patent is extended or adjusted under 35 U.S.C. 154(b) by 835 days.

(21) Appl. No.: 12/591,805

(22) Filed: Dec. 2, 2009

(65) Prior Publication Data

US 2011/0127551 A1 Jun. 2, 2011

(51) Int. Cl.
  *H01L 33/00* (2010.01)
(52) U.S. Cl.
  USPC ............ 257/98; 257/E33.07; 438/29; 438/37
(58) Field of Classification Search
  USPC .................. 257/98, E33.07; 438/29, 37
  See application file for complete search history.

(56) References Cited

U.S. PATENT DOCUMENTS

| | | | | |
|---|---|---|---|---|
| 4,701,008 | A * | 10/1987 | Richard et al. | 385/132 |
| 4,706,101 | A | 11/1987 | Nakamura et al. | |
| 5,544,190 | A | 8/1996 | Mensz | |
| 7,061,026 | B2 * | 6/2006 | Huang | 257/103 |
| 7,355,210 | B2 * | 4/2008 | Ou et al. | 257/95 |
| 2004/0169185 | A1 | 9/2004 | Liu | |
| 2005/0230701 | A1 * | 10/2005 | Huang | 257/103 |
| 2005/0247950 | A1 | 11/2005 | Nakamura et al. | |
| 2007/0184576 | A1 * | 8/2007 | Chang et al. | 438/104 |
| 2007/0277874 | A1 * | 12/2007 | Dawson-Elli et al. | 136/256 |
| 2007/0290222 | A1 * | 12/2007 | Huang | 257/99 |
| 2010/0041172 | A1 * | 2/2010 | Huang | 438/29 |
| 2010/0184249 | A1 * | 7/2010 | Chen | 438/72 |
| 2010/0244077 | A1 * | 9/2010 | Yao | 257/98 |
| 2010/0252103 | A1 * | 10/2010 | Yao et al. | 136/256 |
| 2011/0215296 | A1 * | 9/2011 | Murai et al. | 257/13 |
| 2011/0220938 | A1 * | 9/2011 | Jeong | 257/98 |
| 2011/0266551 | A1 * | 11/2011 | Thompson et al. | 257/76 |
| 2011/0272606 | A1 * | 11/2011 | Forbes et al. | 250/552 |
| 2011/0284822 | A1 * | 11/2011 | Jung et al. | 257/13 |

FOREIGN PATENT DOCUMENTS

| | | |
|---|---|---|
| CN | 2760762 Y | 2/2006 |
| CN | 1271966 A | 11/2011 |
| GB | 2413008 B | 6/2006 |

OTHER PUBLICATIONS

Office Action dated Jun. 25, 2012 issued in corresponding Chinese Patent Application No. 200910222990.2.

* cited by examiner

*Primary Examiner* — Jarrett Stark
(74) *Attorney, Agent, or Firm* — Bacon & Thomas, PLLC

(57) ABSTRACT

A method for enhancing electrical injection efficiency and light extraction efficiency of a light-emitting device is disclosed. The method includes the steps of: providing a site layer on the light-emitting device; placing a protection layer on the site layer; forming a cavity through the protection layer and the site layer; and growing a window layer in the cavity. The shape of the window layer can be well controlled by adjusting reactive temperature, reactive time, and $N_2/H_2$ concentration ratio of atmosphere such that light escape angle of the window layer can be changed.

11 Claims, 8 Drawing Sheets

METHOD FOR ENHANCING ELECTRICAL INJECTION EFFICIENCY AND LIGHT EXTRACTION EFFICIENCY OF LIGHT-EMITTING DEVICES

FIELD OF THE INVENTION

The present invention relates to a method for enhancing electrical injection efficiency and light extraction efficiency of a light-emitting device. More particularly, the present invention relates to a method for preventing current crowding phenomenon, enhancing electrical injection efficiency and light extraction efficiency of a light-emitting device by forming a zinc oxide window layer on the light-emitting device.

BACKGROUND OF THE INVENTION

Gallium nitride (GaN) light-emitting devices have low light extraction efficiency due to large refraction index difference between GaN and air. The light emitted from the active layer in a GaN-based light-emitting device is significantly trapped in the GaN-based layer. Therefore, a serious total internal reflection and re-absorption phenomena would be happened in the GaN-based light-emitting devices. It is well known that a typical p-type GaN (from 300 to 5000 Å thick) layer has a low current conductivity and poor current spreading ability which might cause current crowding phenomenon due to the acceptor (magnesium, Mg) in the GaN crystal having poor activated ability.

LEDs which are based on GaN compounds generally include a transparent insulating substrate, i.e. a sapphire substrate. With a transparent substrate, emission light from the active layer may be utilized from either the substrate or from the opposite end of the LED which is called the "window". However, a good window layer has some unique properties, including a good conductivity and less optical absorption. According to those properties, the insulating sapphire substrate can not be a good window layer since the GaN-based LED structure grown on sapphire substrate is a horizontal device, which will decrease its emission efficacy.

The amount of light generated by an LED is dependent on the distribution of the energizing current across the face of the light-emitting region (upside emission area). It is well known that the current flowing between the electrodes tends to concentrate in a favored path directly under the electrode. This tends to activate corresponding favored portions of the light-emitting region to the exclusion of portions which fall outside the favored path. Further since such favored paths fall under the opaque electrode, the generated light reaching the electrode is lost.

Alternatively, a conductive transparent material, Indium Tin Oxide (ITO) is studied and applied as a current spreading layer. As disclosed in U.S. Pat. No. 5,481,122, a GaP layer is replaced by an ITO layer to serve as a current spreading layer. The optical transmission coefficient of ITO layer is about 90% in the visible range. The electrical resistivity of n-type ITO is 100 times smaller than that of p-type GaP. However, a Schottky contact is formed between the ITO layer and p-type contact layer. It might degrade the optical performance of the LEDs due to the input power consumption.

EP0434233 discloses a light-emitting diode having improved brightness which has a semiconductor substrate underlying active P-N junction layers of AlGaInP for emitting light. A transparent window layer of semiconductor different from AlGaInP overlies the active layers and has a lower electrical resistivity than the active layers and a bandgap greater than the bandgap of the active layers, for minimizing current crowding from a metal electrical contact over the transparent window layer. A layer of lattice mismatched GaP is then grown on the active layers with the GaP having a bandgap greater than the bandgap of the active layers so that it is transparent to light emitted by the LED. The GaAs temporary substrate is then selectively etched away so that the GaP acts as a transparent substrate. A transparent window layer is epitaxially grown over the active layers on the face previously adjacent to the GaAs substrate. The layer of lattice mismatched GaP which is used as a current spreading layer is transparent to light emitted from the active layer, because it has a band-gap which is greater than the band-gap of the active layer. The resistivity of the material of such layer is low owing to the heavy elements doping, and thus the current flowing vertically through the device spreads out laterally over substantially the entire active region.

A disadvantage of this arrangement is that the current spreading layer has to be very thick (up to 50 µm) in order for the current to spread out sufficiently as it flows vertically through the wafer. Such thick layers of bulk semiconductor material are difficult, expensive and time consuming to grow. It will be appreciated that LEDs are commonly used components in electronic apparatus, and thus their price needs to be cost down. Hence, high-intensity LEDs are unreliable owing to threading dislocations and stacking faults which occur near the lattice mismatched AlGaInP and GaP crystal interface, as a result of strain-relaxation in the thick layer.

The present invention provides a solution to the problems mentioned above. Via the invention, electrical injection efficiency and light extraction efficiency of a light-emitting device can be enhanced.

SUMMARY OF THE INVENTION

Accordingly, it is an object of the present invention to provide a method for enhancing electrical injection efficiency and light extraction efficiency of a light-emitting device by forming a window layer with a controllable light escape angle on the light-emitting device.

In accordance with an aspect of the present invention, a method for enhancing electrical injection efficiency and light extraction efficiency of a light-emitting device includes the steps of: providing a site layer on the light-emitting device; placing a protection layer on the site layer; forming a cavity through the protection layer and the site layer; and growing a window layer in the cavity. The shape of the window layer can be well controlled by adjusting reactive temperature, reactive time, and $N_2/H_2$ concentration ratio of atmosphere such that light escape angle of the window layer can be changed. Otherwise, the surface of window layer can also be roughening with regular or irregular patterns by wet or dry etching processes.

Preferably, the window layer includes n-type zinc oxide (n-ZnO) or p-type zinc oxide (p-ZnO).

Preferably, the window layer is formed by hydrothermal treatment, sol-gel method, electro-plating, thermal evaporation, chemical vapor deposition (CVD), or molecular beam epitaxy (MBE).

Preferably, the method further includes a step of: etching the window layer to form a rough surface by wet-etching or dry-etching processes.

Preferably, the window layer has a thickness larger than 1 µm.

Preferably, the site layer includes n-$Al_xIn_yGa_{1-x-y}N$, p-$Al_xIn_yGa_{1-x-y}N$, ITO, Ni/Au, NiO/Au, p-ZnO, or n-ZnO, where $0 \leq x \leq 1$, $0 \leq y \leq 1$, and $0 \leq 1-x-y \leq 1$.

Preferably, the protection layer includes photoresist material or dielectric material.

Preferably, the reactive temperature is higher than 200° C.

Preferably, the atmosphere includes nitrogen, hydrogen, or a mixture thereof.

Preferably, the window layer has a shape of a rectangular prism or a truncated pyramid.

Preferably, the cavity is formed by wet-etching, dry-etching, or photolithography and exposure development processes.

In accordance with an aspect of the present invention, a method for enhancing electrical injection efficiency and light extraction efficiency of a light-emitting device includes the steps of: a light-emitting substrate; a site layer provided on the light-emitting substrate; a cavity formed through the site layer; a protection layer placed on the site layer having the cavity exposed; and a window layer formed in the cavity. The shape of the window layer can be well controlled by adjusting reactive temperature, reactive time, and $N_2/H_2$ concentration ratio of atmosphere such that light escape angle of the window layer can be changed. Otherwise, the surface of window layer can also be roughening with regular or irregular patterns by wet or dry etching processes.

Preferably, the window layer includes n-type zinc oxide (n-ZnO) or p-type zinc oxide (p-ZnO).

Preferably, the window layer is formed by hydrothermal treatment, sol-gel method, electro-plating, thermal evaporation, chemical vapor deposition (CVD), or molecular beam epitaxy (MBE).

Preferably, the site layer includes n-$Al_xIn_yGa_{1-x-y}N$, p-$Al_x$-$In_yGa_{1-x-y}N$, ITO, Ni/Au, NiO/Au, p-ZnO, or n-ZnO, where $0 \leq x \leq 1$, $0 \leq y \leq 1$, and $0 \leq 1-x-y \leq 1$.

Preferably, the protection layer includes photoresist material or dielectric material.

Preferably, the reactive temperature is higher than 200° C.

Preferably, the atmosphere includes nitrogen, hydrogen, or a mixture thereof.

Preferably, the window layer has a regularly or irregularly rough surface formed by wet-etching process or dry-etching process.

Preferably, the window layer has a shape of a rectangular prism or a truncated pyramid.

Preferably, the window layer has a thickness larger than 1 µm.

Preferably, the cavity is formed by wet-etching, dry-etching, or photolithography and exposure development processes.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiment. It is to be noted that the following descriptions of preferred embodiment of this invention are presented herein for purpose of illustration and description only; it is not intended to be exhaustive or to be limited to the precise form disclosed.

Figure 1:
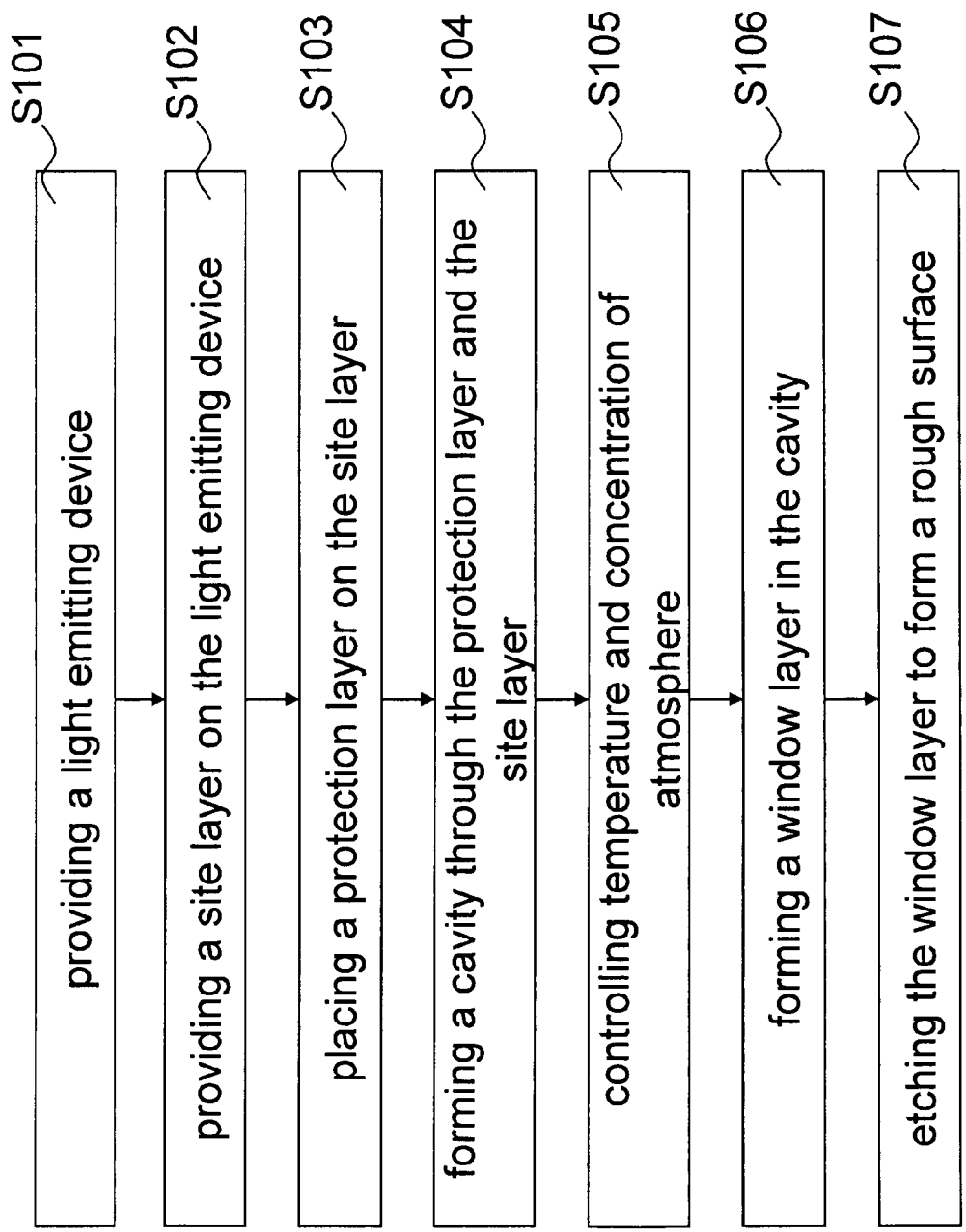
FIG. 1 is a flow chart of a preferred embodiment according to the present invention.
Figure 2:
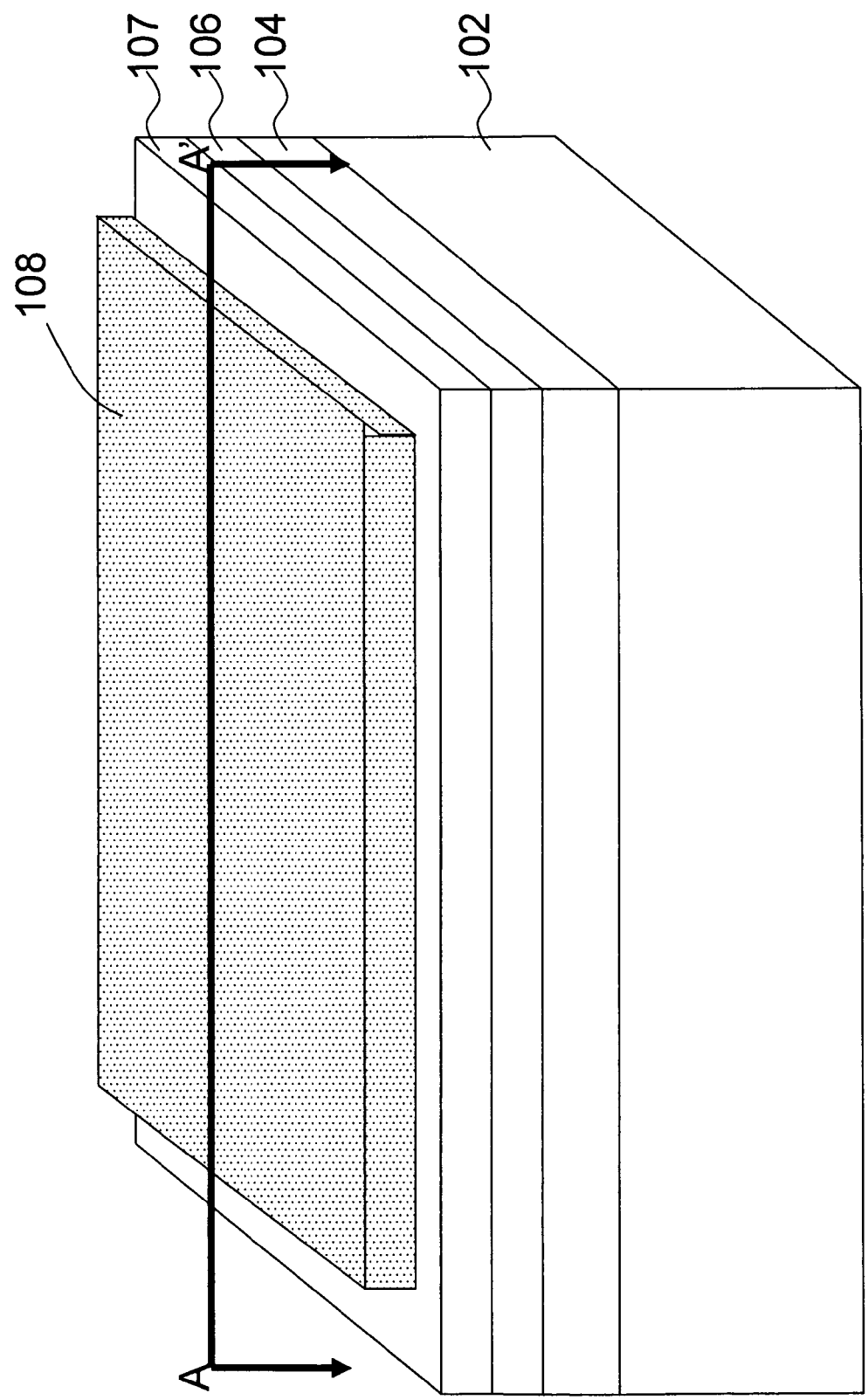
FIG. 2 is a three dimensional view of the present invention.

FIG. 1 is a flow chart of a preferred embodiment according to the present invention showing a method for enhancing electrical injection efficiency and light extraction efficiency of a light-emitting device by forming a window layer with a controllable light escape angle on a light-emitting device. FIG. 2 is a three dimensional view of the present invention. It also shows the relative position for each element in the present invention. Now, please refer to FIGS. 1 and 2. The method of the present invention for enhancing electrical injection efficiency and light extraction efficiency of a light-emitting device by forming a window layer with a controllable light escape angle on a light-emitting device includes the following steps. First, a light-emitting device 102 having a surface layer 104 formed on the top surface thereof is provided (as shown at step S101). In this embodiment, the surface layer 104 is made of p-GaN. However, it should be noted that the surface layer 104 of the present invention is not limited to p-GaN. It can also be made of p-$Al_xGa_{1-x}N$, p-$In_xGa_{1-x}N$, p-GaN/$In_xGa_{1-x}N$ SLs, p-$Al_xGa_{1-x}N$/GaN SLs, p-$Al_xIn_yGa_{1-x-y}N$, p-$In_{x1}Al_{y1}Ga_{1-x1-y1}N$/$In_{x2}Al_{y2}Ga_{1-x2-y2}N$ SLs, n+-$Al_xIn_yGa_{1-x-y}N$, ITO, p-ZnO, ZnO, or Ni/Au, where $0 \leq x$, x1, $x2 \leq 1$, $0 \leq y$, y1, $y2 \leq 1$, $0 \leq 1-x1-y1 \leq 1$, and $0 \leq 1-x2-y2 \leq 1$. In other words, the surface layer 104 is not limited to a conductive type of P or N.

The light-emitting device 102 used in this embodiment is a nitride light emitting diode which has an energy band gap equivalent to wavelength of 200 to 650 nm.

Later, a site layer 106 is provided on the surface layer 104 of the light-emitting device 102 (as shown at step S102). The site layer 106 can be made of n-$Al_xIn_yGa_{1-x-y}N$, p-$Al_xIn_yGa_{1-x-y}$ N, ITO, Ni/Au, NiO/Au, p-ZnO, or n-ZnO, where $0 \leq x \leq 1$, $0 \leq y \leq 1$, and $0 \leq 1-x-y \leq 1$.

Figure 3:
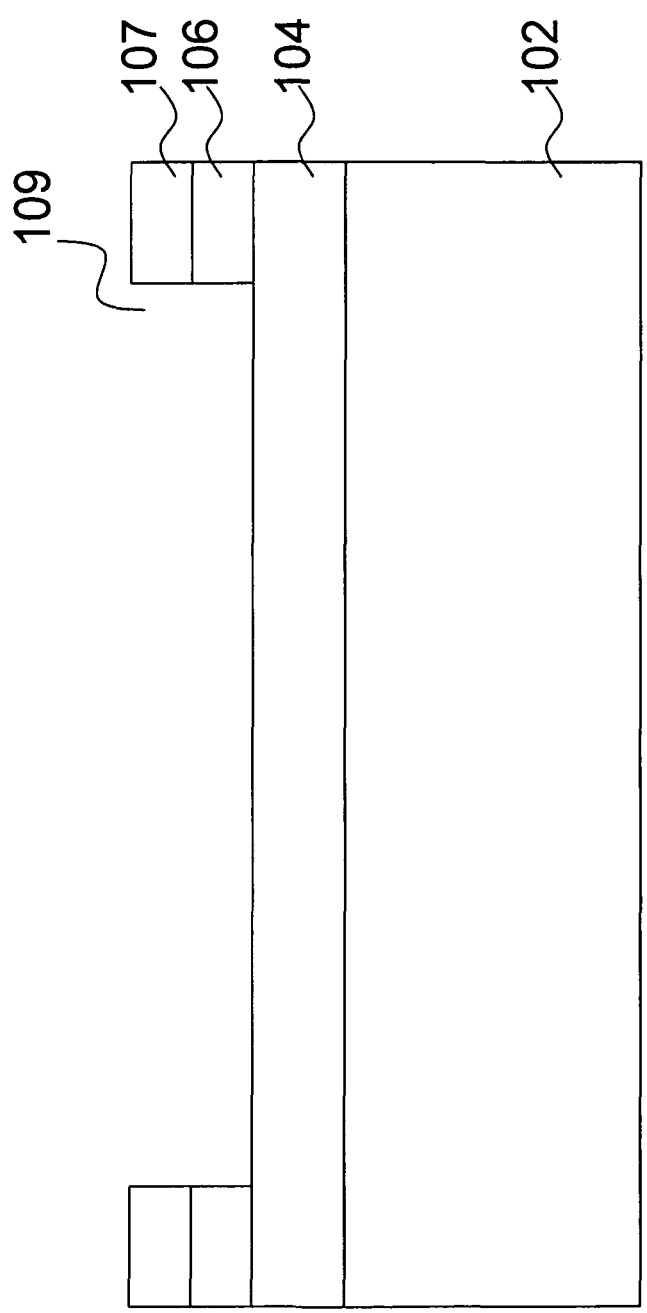
FIG. 3 is a cross-sectional view showing a cavity of the present invention.

Next, a protection layer 107 is placed on the site layer 106 (as shown at step S103). Please refer to FIG. 3. It is a cross-sectional view showing a cavity 109 of the present invention. The cavity 109 is formed through the protection layer 107 and the site layer 106 by wet-etching, dry-etching, or photolithography and exposure development processes (as shown at step S104). The protection layer 107 is made of photoresist and dielectric materials while photolithographic, exposure development processes, and wet-etching or dry-etching processes are used.

Figure 4:
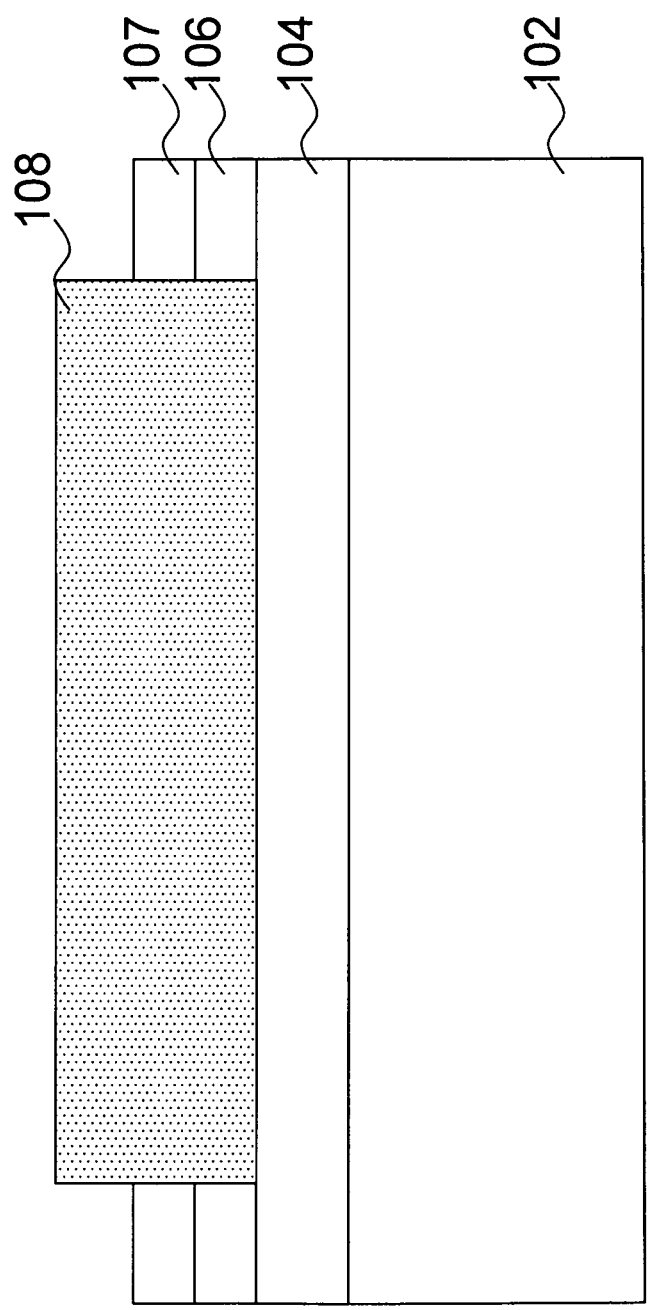
FIG. 4 is cross-sectional view along the A-A' cross section in FIG. 2 showing a window layer formed in a cavity.

Then, a window layer 108 is formed in the cavity 109, as shown in FIG. 4. The protection layer 107 is for positioning the window layer 108 into the cavity 109 and preventing the window layer 108 from growing at a place other than the cavity 109.

The shape of the window layer 108 can be well controlled by adjusting reactive temperature, reactive time, and concentration of atmosphere such that light escape angle of the window layer 108 can be changed (as shown at steps S105-S106).

Figure 6A:
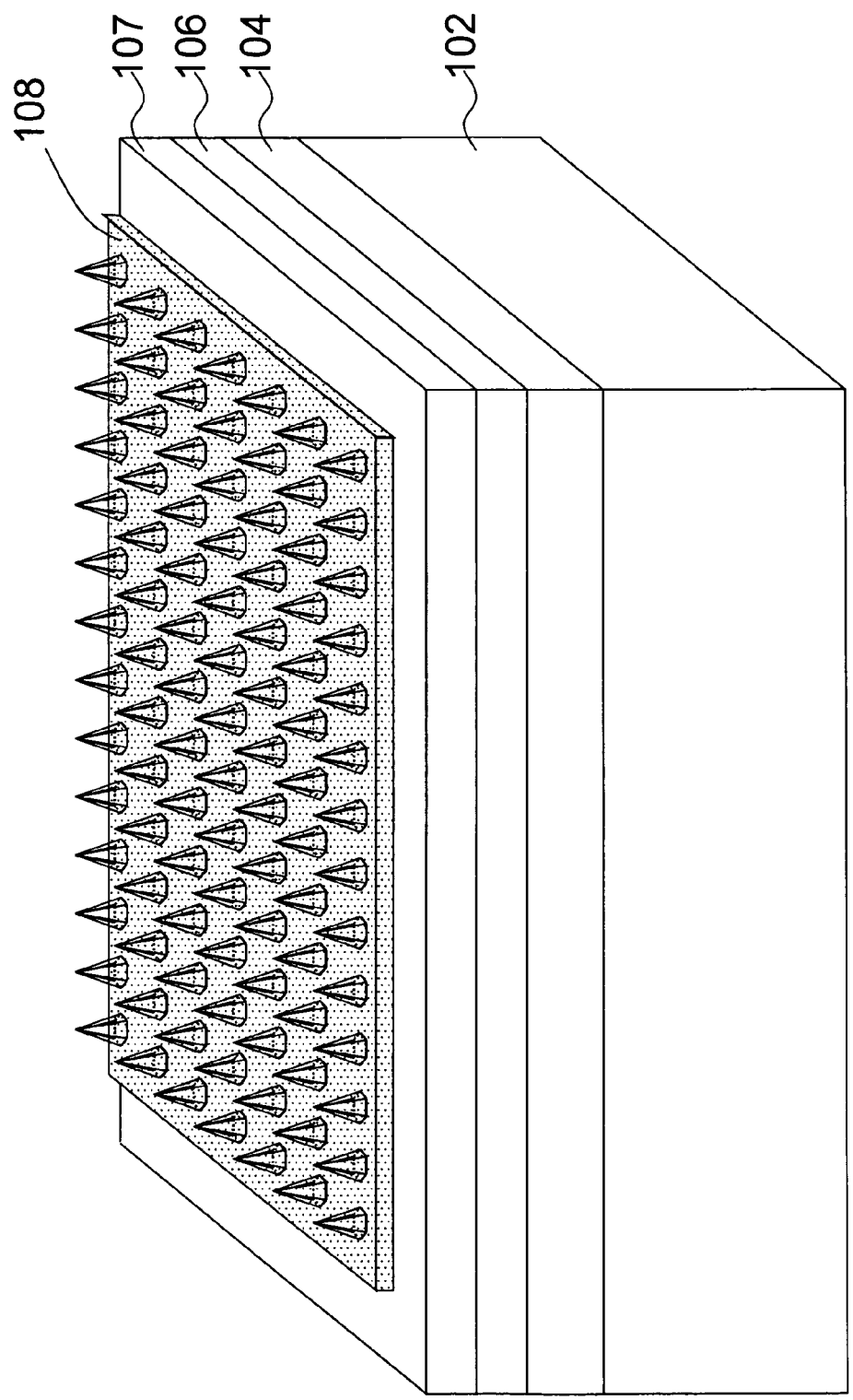
FIG. 6A is a schematic diagram of a window layer having a regularly rough surface.
Figure 6B:
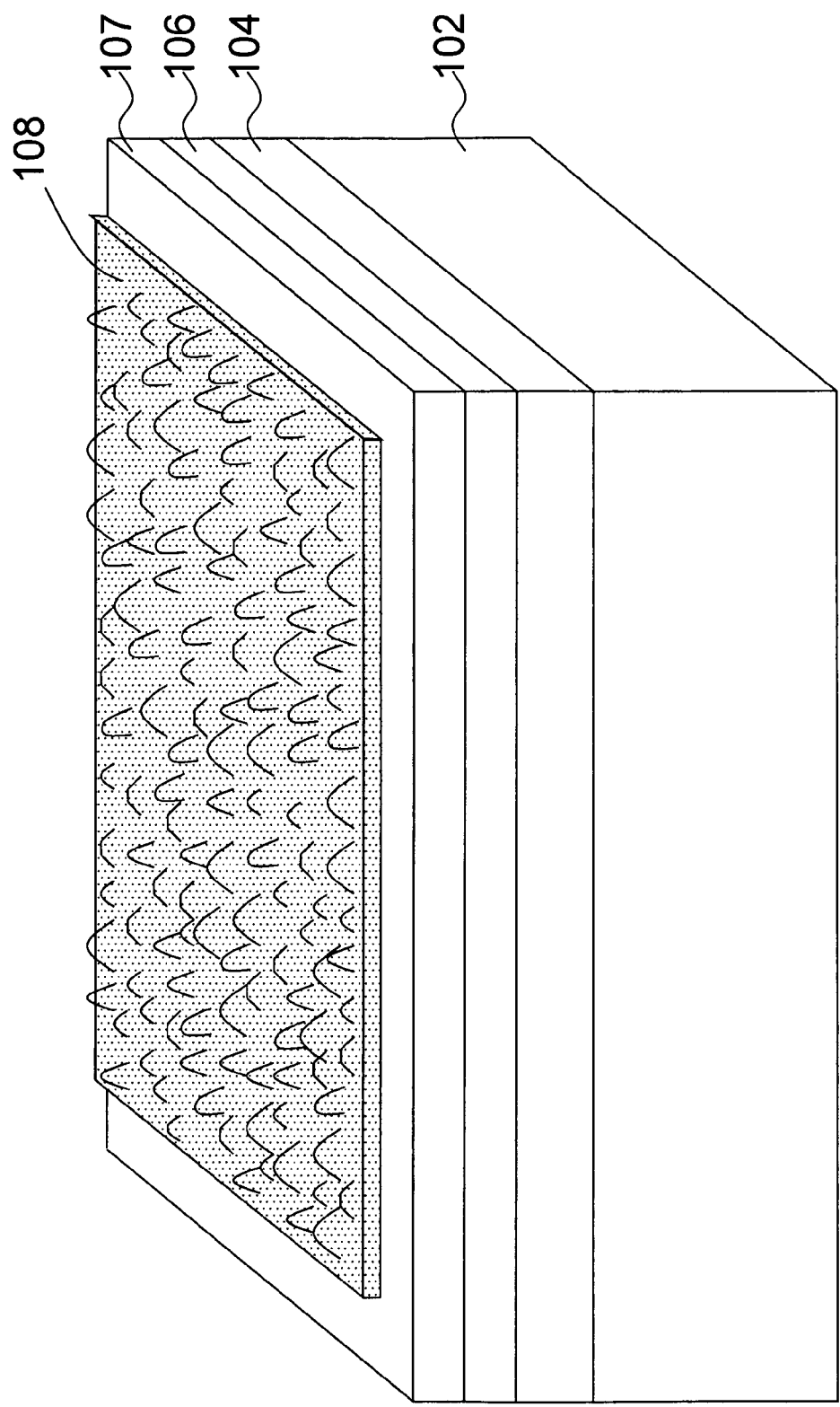
FIG. 6B is a schematic diagram of a window layer having a irregularly rough surface.

After the window layer 108 is formed, the window layer 108 is etched to form a rough surface regularly (as shown in FIG. 6A) or irregularly (as shown in FIG. 6B), so that light extraction efficiency can be further enhanced (as shown at step S107). Before the window layer 108 is etched, a mask (not shown) is used on the window layer 108 for limiting the etching area. The mask can be made of photoresist and dielectric materials. Then, the mask is defined by photolithography and exposure development processes. Later, the window layer 108 is etched by wet-etching or dry-etching processes. It should be understood that the window layer 108 is not limited to having a rough surface.

The window layer 108 can be made of n-type zinc oxide (n-ZnO) or p-type zinc oxide (p-ZnO).

As mentioned above, GaN light-emitting devices have low light extraction efficiency due to large refraction index difference between GaN and air. The light emitted from the active layer in a GaN light-emitting device is significantly trapped in the GaN layer while the GaN layer is too thick, and a serious total internal reflection and optical re-absorption are occurred. However, a thin GaN layer may have a low current conductivity and poor current spreading ability which may cause current crowding phenomenon.

Due to the fact that ZnO and GaN have close lattice constant and the mismatch of them is less than 2%, the ZnO window layer is able to act as a substitute for the GaN layer. In other words, the ZnO window layer of the present invention may overcome the absorption problem caused by a thick layer of GaN layer and the current crowding issue caused by a thin layer of GaN layer. Different from the GaN layer, the light extraction efficiency of the ZnO window layer does not decrease while the thickness of the ZnO window layer increases. Therefore, the thickness of the ZnO window layer is not limited. For example, it can have a thickness larger than 1 μm. Moreover, the ZnO window layer has a better current spreading ability than that of the GaN layer.

In this embodiment, the window layer 108 is formed by hydrothermal treatment. First, the light-emitting device having the cavity formed therein is cleaned with acetone, methanol, and deionized water for about 5 minutes, respectively. Then, the light-emitting device is dried by a nitrogen spray gun. Next, a seed layer of ZnO is formed in the cavity for increasing adhesion.

The seed layer of ZnO is prepared by dissolving zinc acetate ($Zn(CH_3COO)_2 \cdot H_2O$) in 2MOE ($CH_3O(CH_2)_2OH$, 2-methoxyethanol), each having a concentration of 0.5M, and then stirring the resultant solution for 2 hours while heating at a temperature of 65° C., so that a transparent gel solution is obtained. Later, the transparent gel solution is spin coated onto the top surface of the light-emitting device. Next, a ZnO seed layer is obtained by thermal annealing having the transparent gel solution deposited thereon at a temperature of 130° C. for 60 minutes. In this embodiment, the ZnO seed layer is used for ZnO particles to grow as a ZnO layer.

It should be understood that the seed layer is not limited to be made of ZnO, and can also be made of gold (Au), silver (Ag), Tin (Sn), or cobalt (Co).

After the seed layer is formed, the light-emitting device is placed facing downwards in a growth solution of zinc nitrate hexahydrate ($Zn(NO_3)_2 \cdot 6H_2O$) having a purity of 98% and hexamethylenetetramine ($C_6H_{12}N_4$, HMT) having a purity of 99.5%, each having a concentration of 0.5M. Later, it is heated in a dryer at a low temperature of 90° C. for about 3 hours. After being heated, it is taken out and washed with deionized water. Then, a ZnO layer having a number of rods could be obtained. The growth rate, dimension and height of ZnO rods can be controlled by adjusting the temperature, concentration and growth time.

During the hydrothermal treatment, ZnO is formed according to the following formulas:

$$Zn^{2+} + 2OH^- \rightarrow Zn(OH)_2$$

$$Zn(OH)_2 \xrightarrow{\Delta} ZnO + H_2O.$$

In the aforementioned deposition mechanism, ZnO begins to form onto the seed layer once the concentrations of zinc ions and hydroxide ions reach saturation. Due to anisotropic characteristic of atomic bonding, atoms tend to flow towards low energy during nucleation causing asymmetric growth in a specific direction which thereby forms a rod/thread shape array structure.

Although hydrothermal treatment is used in the present embodiment, it should be understood that the present invention is not limited to hydrothermal treatment, and can also use thermal evaporation, sol-gel method, chemical vapor deposition (CVD), or molecular beam epitaxy (MBE).

Moreover, even though spin coating is used for disposing the seed layer onto the GaN substrate in the present embodiment, it should not be limited thereto, and can also use dip coating, evaporation, sputtering, atomic layer deposition, electrochemical deposition, pulse laser deposition, metal-organic chemical vapor deposition, or thermal annealing.

In this embodiment, the atmosphere includes nitrogen, hydrogen, or a mixture thereof. Moreover, the reactive temperature is higher than 200° C.

The density of the ZnO rods formed on the seed layer in the cavity is controlled by the concentration of the atmosphere. Later, numbers of the ZnO rods may start bonding together while the density of the ZnO rods gradually increase. After the ZnO rods are closely bonded together, the reaction temperature is raised, so that the chemical bonding between the ZnO rods are damaged, thereby forming a continuous layer of ZnO (i.e. window layer).

Figure 7:
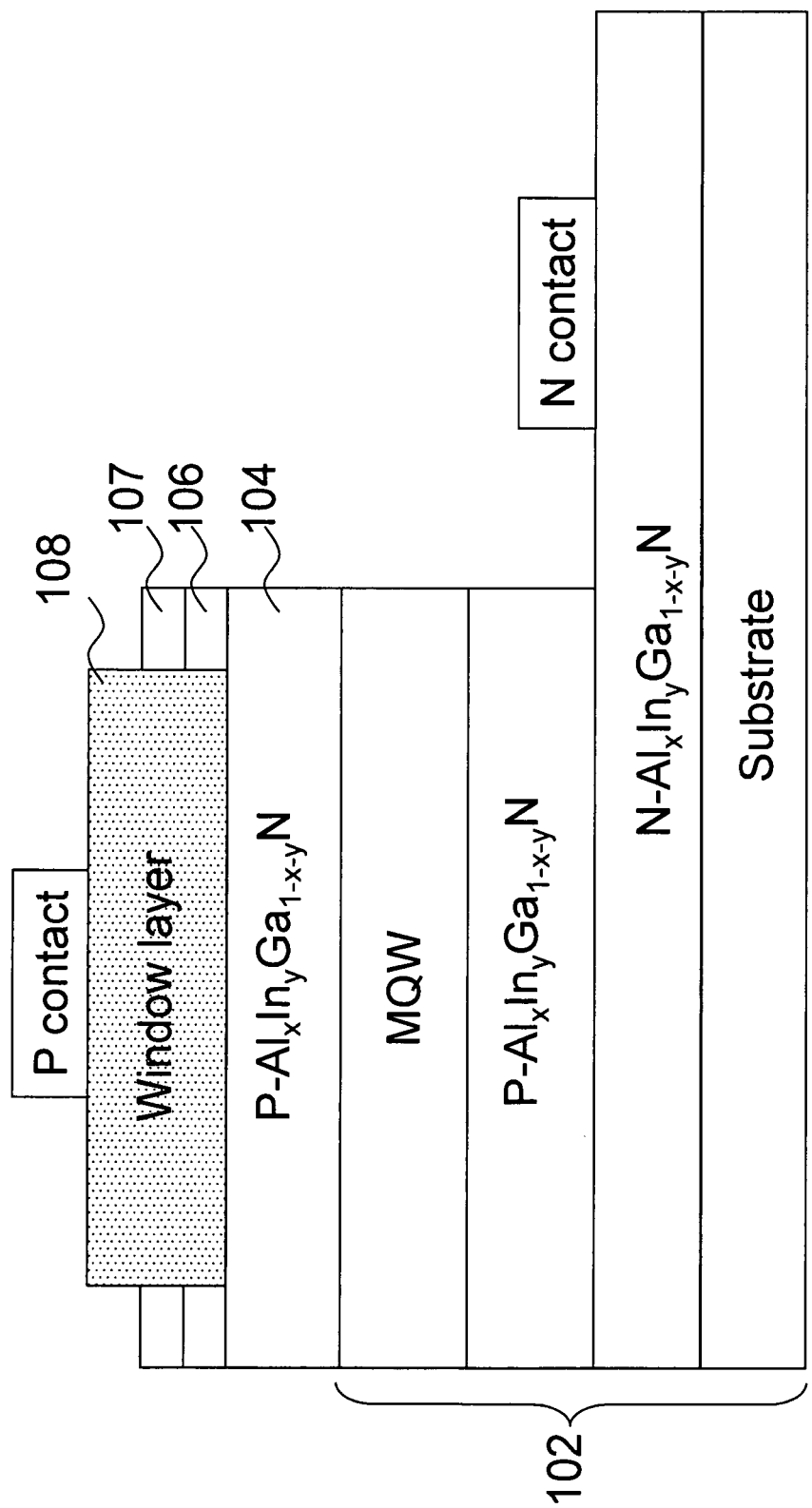
FIG. 7 is a standard schematic diagram of a window layer of the present invention on a light-emitting device.

FIG. 7 is a schematic diagram of a window layer on a light-emitting device. As mentioned above, although the surface layer 104 in this embodiment is made of p-GaN, it is not limited to so. It can also be made of p-$Al_xGa_{1-x}$N, p-$In_xGa_{1-x}$N, p-GaN/$In_xGa_{1-x}$N SLs, p-$Al_xGa_{1-x}$N/GaN SLs, p-$Al_x In_yGa_{1-x-y}$N, p-$In_{x1}Al_{y1}Ga_{1-x1-y1}$N/$In_{x2}Al_{y2}Ga_{1-x2-y2}$SLs, n+-$Al_xIn_yGa_{1-x-y}$N, ITO, p-ZnO, ZnO, or Ni/Au, where $0 \leq x$, x1, x2 $\leq 1$, $0 \leq y$, y1, y2 $\leq 1$, $0 \leq 1$-x1-y1 $\leq 1$, and $0 \leq 1$-x2-y2 $\leq 1$. In other words, the surface layer 104 is not limited to a conductive type of P or N.

Figure 5:
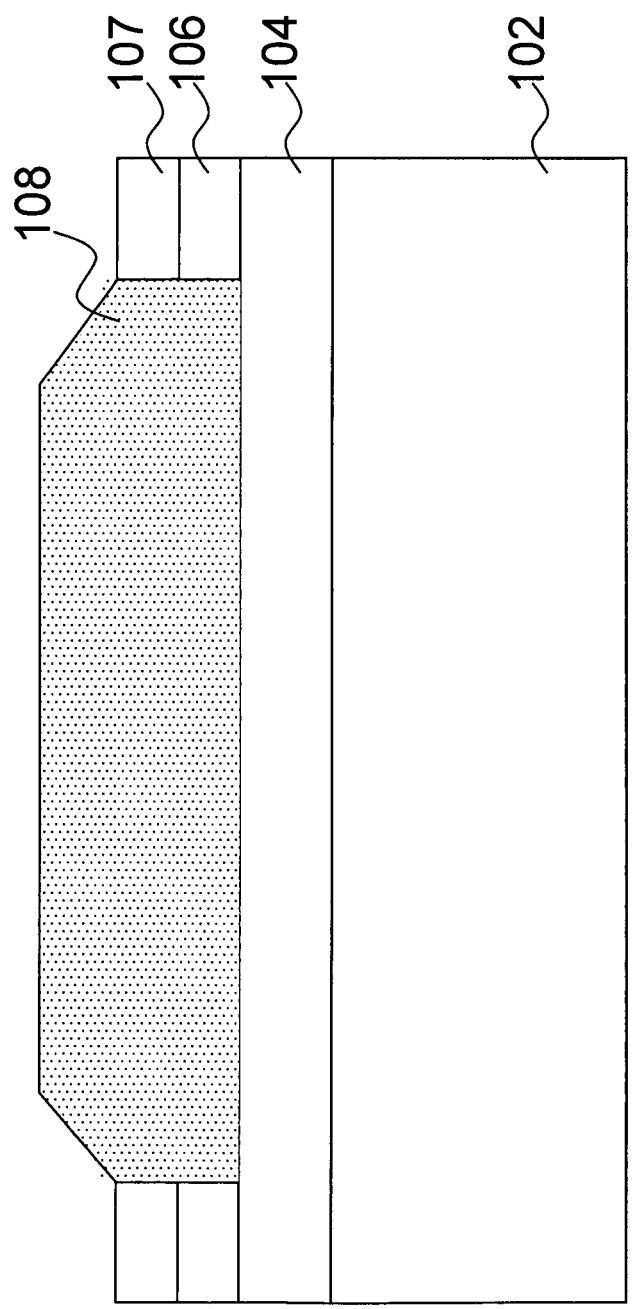
FIG. 5 is a cross-sectional view showing a window layer which has a truncated pyramid shape.

Although the window layer 108 in this embodiment may have a shape of a rectangular prism (as shown in FIG. 4) or a truncated pyramid (as shown in FIG. 5) which is limited by the shape of the cavity, it should be understood that the shape of the window layer is not limited thereto. It can also have a shape of a hexagonal pyramid or a truncated hexagonal pyramid.

The light beams emit in a specified direction from the light-emitting device 102 according to the structure of the window layer 108. In other words, the light extraction area of the window layer which has a truncated pyramid shape is better than the window layer which has a rectangular prism shape. In practice, the light extraction of the truncated pyramid shape window layer is better than the rectangular prism shape window layer for at least 10%. Hence, light escape angle of a light-emitting device can be controlled by changing the shape of the window layer 108. Furthermore, the window layer of the present invention not only can improve light extraction, but also can provide high current conductivity and well current spreading.

While the invention has been described in terms of what is presently considered to be the most practical and preferred embodiment, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A light emitting device having enhanced electrical injection efficiency and light extraction efficiency, comprising:
   a light-emitting device;
   a conductive site layer provided on the light-emitting device;
   a cavity formed through the conductive site layer;
   a protection layer placed on the conductive site layer having the cavity exposed; and
   a window layer formed in the cavity;
   wherein the shape of the window layer can be well controlled by adjusting reactive temperature, reactive time, and $N_2/H_2$ concentration ratio of atmosphere such that light escape angle of the window layer can be changed.

2. The light-emitting device according to claim 1, wherein the window layer comprises n-type zinc oxide (n-ZnO) or p-type zinc oxide (p-ZnO).

3. The light-emitting device according to claim 1, wherein the window layer is formed by hydrothermal treatment, sol-gel method, electro-plating, thermal evaporation, chemical vapor deposition (CVD), or molecular beam epitaxy (MBE).

4. The light-emitting device according to claim 1, wherein the conductive site layer comprises n-$Al_xIn_yGa_{1-x-y}N$, p-$Al_xIn_yGa_{1-x-y}N$, ITO, Ni/Au, NiO/Au, p-ZnO, or n-ZnO, where $0 \leq x \leq 1$, $0 \leq y \leq 1$, and $0 \leq 1-x-y \leq 1$.

5. The light-emitting device according to claim 1, wherein the protection layer comprises photoresist materials or dielectric materials.

6. The light-emitting device according to claim 1, wherein the reactive temperature is higher than 200° C.

7. The light-emitting device according to claim 1, wherein the atmosphere comprises nitrogen, hydrogen, or a mixture thereof.

8. The light-emitting device according to claim 1, wherein the window layer has a regularly or irregularly rough surface formed by wet etching process or dry etching process.

9. The light-emitting device according to claim 1, wherein the window layer has a shape of a rectangular prism or a truncated pyramid.

10. The light-emitting device according to claim 1, wherein the window layer has a thickness larger than 1 μm.

11. The light-emitting device according to claim 1, wherein the cavity is formed by wet etching process, dry etching process, or photolithography and exposure development processes.

* * * * *